(12) United States Patent
Yonezawa (10) Patent No.: US 6,897,450 B2
(45) Date of Patent: May 24, 2005

(54) ELECTROMAGNETIC FIELD SUPERIMPOSED LENS AND ELECTRON BEAM DEVICE USING THIS ELECTROMAGNETIC FIELD SUPERIMPOSED LENS

(75) Inventor: Akira Yonezawa, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 559 days.

(21) Appl. No.: 09/978,258

(22) Filed: Oct. 15, 2001

(65) Prior Publication Data

US 2002/0096641 A1 Jul. 25, 2002

(30) Foreign Application Priority Data

Oct. 20, 2000 (JP) ...................................... 2000-321321

(51) Int. Cl.⁷ ............................................... H01J 37/20
(52) U.S. Cl. ............................ 250/396 R; 250/396 ML
(58) Field of Search .................... 250/396 R, 396 ML, 250/310

(56) References Cited

U.S. PATENT DOCUMENTS 6,107,633 A * 8/2000 Frosien et al. ....... 250/396 ML
6,504,164 B2 * 1/2003 Yonezawa et al. ....... 250/492.3

* cited by examiner

*Primary Examiner*—Kiet T. Nguyen
(74) *Attorney, Agent, or Firm*—Adams & Wilks (57) ABSTRACT

A magnetic pole of a magnetic field type lens is divided into a first magnetic pole section that is at ground potential, and a second magnetic pole section facing a sample and to which a negative high voltage is applied, the first magnetic pole section and the second magnetic pole section 212 being electrically insulated from each other, and an electric field type bi-potential lens is made up of an electrode attached to the first magnetic pole section so as to surround an electron beam path. High resolution observation with small chromatic aberration factor Cs, Cc is made possible without forming a positive high voltage section inside an electron beam path of a lens barrel.

19 Claims, 5 Drawing Sheets

ELECTROMAGNETIC FIELD SUPERIMPOSED LENS AND ELECTRON BEAM DEVICE USING THIS ELECTROMAGNETIC FIELD SUPERIMPOSED LENS

BACKGROUND OF THE INVENTION

1. Technical Field

The present invention relates to an electromagnetic field superimposed lens for an electron beam device capable of high resolution observation, and to an electron beam device using this electromagnetic field superimposed lens.

2. Related Art

In order to perform inspection or observation of the shape of a fine pattern using an electron beam device, various electron beam devices such as a scanning electron microscope have conventionally been used, and in particular, there has been a high demand for high resolution observation accompanying the fact that electron beam devices have become ultra fine in recent years. As an electromagnetic lens enabling high resolution observation, Japanese patent laid open No. Hei. 6-24106 disclosed a structure where a decelerating electrical field is caused to overlap a lens magnetic field, reducing the spherical aberration factor Cs and chromatic aberration factor Cc.

Figure 5:
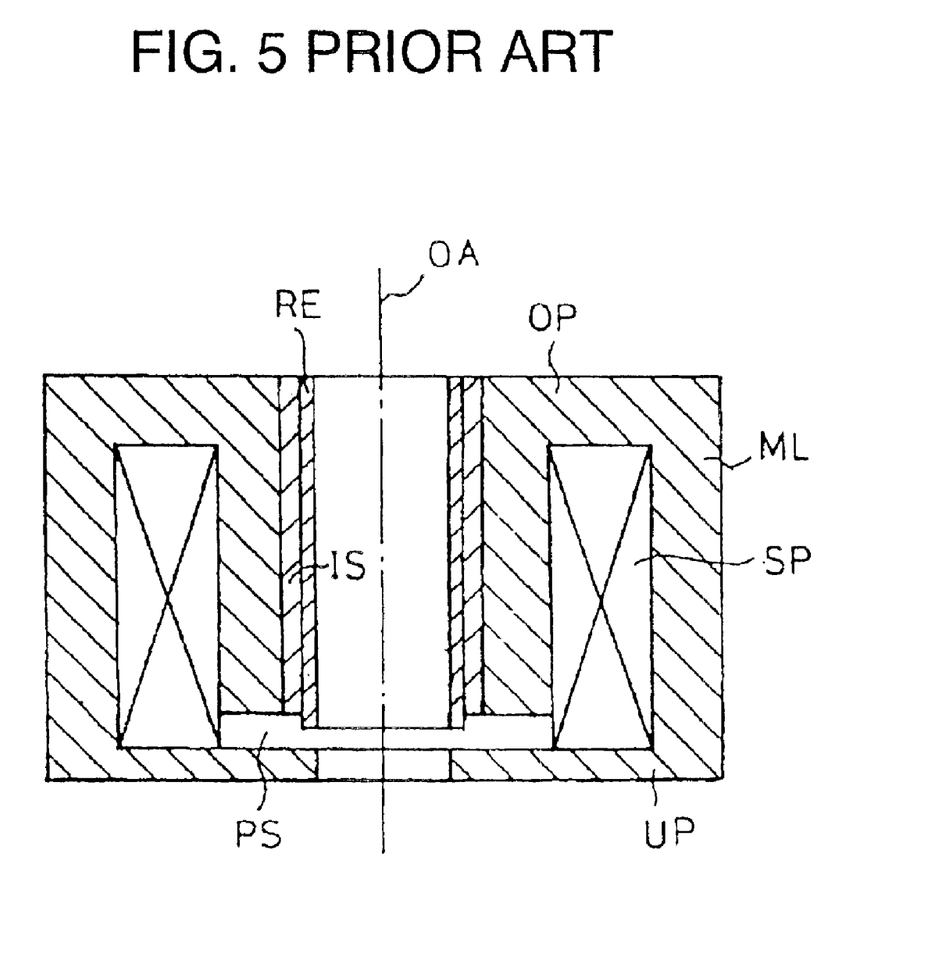
FIG. 5 is a cross sectional drawing of an electromagnetic field superimposed lens of the related art.

As shown in FIG. 5, this electromagnetic field superimposed lens is formed from a bi-potential lens (electrostatic immersion lens) comprising a magnetic field lens ML, an electrode RE, and a lower magnetic pole UP, and has a structure where a magnetic field is generated in a space containing a pole piece gap PS if electric current flows in a coil SP. A cylindrical electrode RE is provided coaxially with an optical axis OA inside an upper pole piece OP via an insulator IS. A decelerating electric field is formed across the electrode RE by applying a positive potential to the electrode RE and keeping a lower pole piece UP at ground potential. A lens having small spherical aberration factor Cs and chromatic aberration factor Cc is obtained from the action of superimposing a magnetic field occurring across the pole piece gap PS and the decelerating electric field.

However, with the above described electromagnetic field superimposed lens, there is a problem in that the device structure becomes complicated and it is easy for damage to occur. Specifically, since a sample and a lens electrode facing the sample are held at ground potential, in causing superimposing of a decelerating electrical field having the effect of decreasing aberration factor on a magnetic field, a positive high potential must be formed inside the lens barrel, but with the structure shown in FIG. 5 a positive high potential +9 kV is applied to the electrode RE and an electrode gun anode.

Although not shown in FIG. 5, in an actual lens barrel a vacuum tube, a collimating lens, a deflector, an air lock valve and a movable aperture are arranged between an electron beam generator and an objective lens. Accordingly, when a high voltage is applied to each of these elements, as described above, measures, such as providing an optical system, are required to cope with this. Further, problems arise such as damage and electron beam charging due to electrical discharge from the high voltage sections, and it is easy for disadvantages such as cost increase, and increase in the frequency of maintenance to occur to a significant increase in the number of components. There is proposed a structure where midway along the inside of lens barrel, the potential falls from a high potential to ground potential with advancement of an electron beam and a high potential is applied again to the electrode RE, but it becomes necessary to take into consideration a lens operation at voltage varying sections, and there is a separate problem that an electron optical system is made complicated.

SUMMARY OF THE INVENTION

An object of the present invention is to provide an electromagnetic field superimposed lens and an electron beam device using this electromagnetic field superimposed lens that can solve the problems described above that exist in the related art.

Another object of the present invention is to provide an electromagnetic field superimposed lens and an electron beam device using this electromagnetic field superimposed lens that can solve the problems described above that exist in the related art and which results in simplification of the structure, and particularly enables stable and high resolution observation with a low acceleration sample irradiation voltage.

In order to solve the above described problems, according to the present invention there is proposed an electromagnetic field superimposed lens, having an electrical field bi-potential lens provided in a magnetic field lens, wherein a magnetic pole of the magnetic field lens is divided into a first magnetic pole section at an earth potential, and a second magnetic pole section, facing a sample, to which a negative potential is applied, as well as to the sample, the two magnetic pole sections being electrically insulated from each other, and the electric field bi-potential lens is made up of an electrode connected to the first magnetic pole section so as to surround an electron beam path, and the second magnetic pole section.

It is also possible for the electromagnetic pole to be formed by making one end of the first electromagnetic pole section and one end of the second magnetic pole section integral via an electrically insulating member.

It is also possible for an excitation coil to be attached to the first electromagnetic pole section, with another end of the second magnetic pole section extending getting narrower towards the sample, to form a magnetic gap between the other end of the first magnetic pole section and the other end of the second magnetic pole section.

Also, according to the present invention there is proposed an electromagnetic field superimposed lens, having an electrical field bi-potential lens provided in a magnetic field lens, wherein a magnetic pole of the magnetic field lens is divided into a first magnetic pole section at an earth potential, and a second magnetic pole section, facing a sample, to which a negative potential is applied, as well as to the sample, the two magnetic pole sections being electrically insulated from each other, and the electrical field bi-potential lens is comprised of a high resistance body provided between the first magnetic pole section and the second magnetic pole section so as to surround an electron beam path, so as to apply a potential difference between the first magnetic pole section and the second magnetic pole section.

It is also possible for the electromagnetic pole to be formed by making one end of the first electromagnetic pole section and one end of the second magnetic pole section integral via an electrically insulating member.

It is also possible for an excitation coil to be attached to the first electromagnetic pole section, with another end of the second magnetic pole section extending getting narrower towards the sample, to form a magnetic gap between the other end of the first magnetic pole section and the other end of the second magnetic pole section.

According to the present invention, there is also proposed an electron beam device using any one of the above described electromagnetic field superimposed lenses.

DESCRIPTION OF THE PREFERRED EMBODIMENTS

The following is a detailed description, with reference to the drawings, of an example of an embodiment of the present invention.

Figure 1:
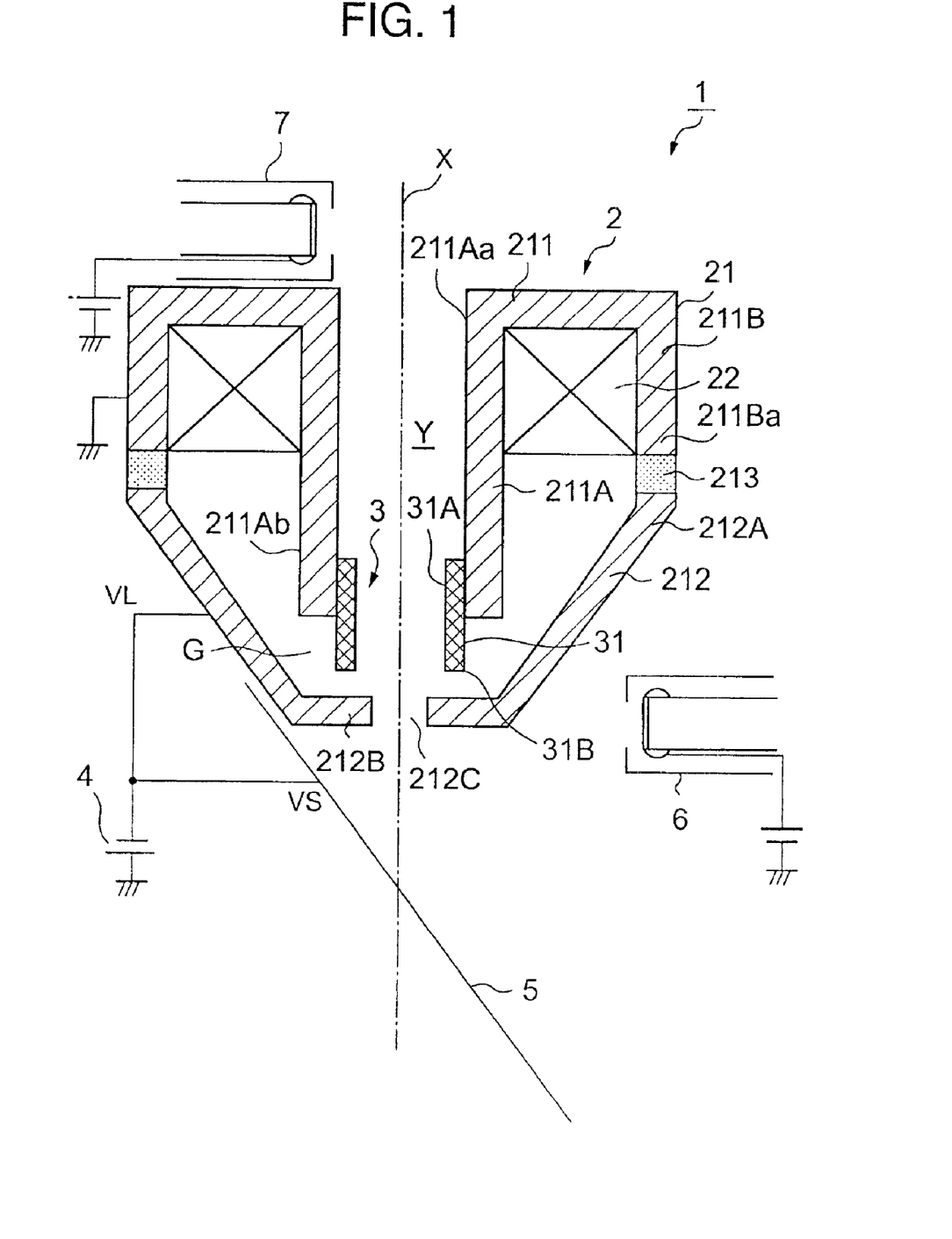
FIG. 1 is a cross sectional drawing showing one example of an embodiment of an electromagnetic field superimposed lens of the present invention.

FIG. 1 is a cross sectional drawing showing one example of an embodiment of an electromagnetic field superimposed lens of the present invention. The electromagnetic field superimposed lens 1 (or compound lens) is constructed as an objective lens for an electron beam device such as a scanning electron microscope used to examine or observe the shape of a micro-electronic device, and is an electrostatic collimating lens having a structure where an electrical field type bi-potential lens 3 built in to a magnetic field type lens 2, a magnetic focusing action is imparted to an electronic beam penetrating along an optical axis X due to the magnetic field type lens 2, and at the same time a decelerating electrical field due to the electrical field type bi-potential lens 3 is superimposed on the magnetic field to reduce an aberration factor of the lens, so as to enable high resolution observation.

The magnetic field lens 2 has an excitation coil 22 provided in the magnetic pole 21. The magnetic pole has a first magnetic pole section 211 and a second magnetic pole section 212, with the first magnetic pole section 211 and the second magnetic pole section 212 being made integral via an insulating body 213 formed from an electrically insulating material. The first magnetic pole section 211 is provided on a penetration side of the electron beam that penetrates along the optical axis X, and an overhanging section 211B having an L-shaped cross section extends in a radially outward direction integrally with one end edge 211Aa of a cylindrical main section 211A forming a cylindrical passage Y allowing passage of the electron beam. The excitation coil 22 is housed in an annular space enclosed by the main section 211A and the overhanging section 211B.

On the other hand, the second magnetic pole 212 is formed substantially in a bowl or conical shape, with a large diameter opening edge section 212A, begin one end of the second magnetic pole section 212, being fixed to a tip section 211Ba of the overhanging section 211B via the insulating body 213. The insulating body 213 is an annular body corresponding to the size and shape of the other end edge 211Ab and the main section 211A, and the overhanging section 211B is integral with the second magnetic pole section 212 via the insulating body 213. The tip section 212B of the second magnetic pole section 212 faces the other end edge 211Ab of the main section 211A with a specified distance between them, and in this way magnetic gap G is formed. A passage hole 212C for allowing passage of the electron beam is provided in the tip section 212B, coaxially with the optical axis X.

Since the magnetic lens 2 has the above described structure, if electric current flows in the excitation coil 22 an extremely strong magnetic field is generated in the magnetic gap G, and it is thus possible to form a focusing magnetic field inside the passage Y. Accordingly, an electron beam from an electron gun (not shown), going along the optical axis X and penetrating the electromagnetic field superimposed lens 1 is subjected to a focusing operation by this magnetic field when it passes through the passage Y.

One electrode of the electric field type bi-potential lens is formed from a non-magnetic conductive material, and is provided with a cylindrical electrode 31 having an outer diameter set to a value that corresponds to the inner diameter of the main section 211A. One end section 31A of the electrode 31 is inserted into the other end edge 211Ab of the main section 211A, as shown in the drawing, and the electrode 31 is fixed to the magnetic pole 21 so as to be electrically connected to the first magnetic pole section 211. The other end edge 31B of the electrode 31 faces the tip end 212B of the second magnetic pole section 212 with a specified distance between them both.

The magnetic pole 21 is grounded, and a negative voltage VL (for example, −1 kV) is applied to the second magnetic pole section 212 using a battery 4. Accordingly, a decelerating electrical field arises between the electrode 31 and the tip section 212B, and in this way an electromagnetic field superimposed lens capable of superimposing the decelerating electrical field on the magnetic field having the focusing action due to the magnetic type lens 2 is formed. As will be understood from the above description, the electrode 31 and the tip section 212B function as a pair of electrodes of the electrical field type bi-potential lens 3, forming a bi-potential lens.

The ground potential section of the electromagnetic field superimposed lens 1 is connected to a ground potential sample chamber (not shown), while the second magnetic pole section 212 and the sample 5 to which the negative voltage is applied are positioned inside the sample chamber that held in a vacuum. The electron beam generated from the electron gun (not shown) and incident along the optical axis X is subjected a converging action due to the magnetic field generated in the magnetic gap G of the magnetic field type lens 2 and also to the action of a decelerating electrical field generated by the electrical field type bi-potential lens 3, and converged on the sample 5, and at the same time the electron beam is scanned on an observation surface of the sample 5 by a scanning deflector (not shown). Secondary electrons produced from the sample 5 are detected by a secondary electron detector 6 placed transverse to the electromagnetic field superimposed lens 1, or by a secondary electron detector 7 placed above the lens. Since the negative potential VL applied to the second magnetic pole section 212 directly constitutes the negative voltage VS applied to sample 5, no disturbance is produced in an electrical field by tilting of the sample 5, enabling high resolution observation even if the sample is titled to a large tilt angle.

Figure 2A:
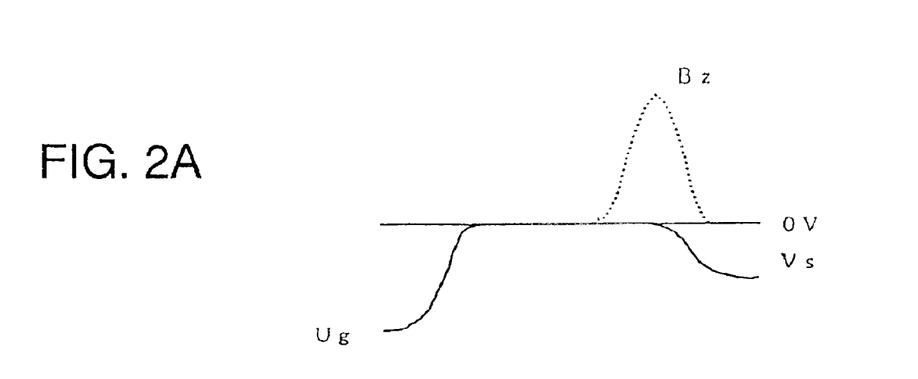
FIG. 2A is a graph showing potential distribution and magnetic field distribution for the electromagnetic field superimposed lens of the present invention.

FIG. 2A shows potential distribution and magnetic field distribution for the electromagnetic field superimposed lens 1 shown in FIG. 1. An electron beam from the electron gun cathode (potential Ug, for example 2 kV) is accelerated between the electron gun cathode and electron gun anode (potential: ground), and scanned inside the ground potential lens barrel at an energy Ug (:2 kV). After that, in the electromagnetic field superimposed lens 1, there is a magnetic field focusing action due to the magnetic field type lens 2, as well as the action of a decelerating electrical field due to the electrical field type bi-potential lens 3 superimposed on the magnetic field, and the electron beam is irradiated on the sample 5 (potential VS, for example, −1 kV) to which the negative potential is applied at an energy of VS−Ug (: 1 kv). Accordingly, the aberration factor of the lens is reduced by the action of the magnetic field and the decelerating electrical field superimposed on the magnetic field.

Figure 2B:
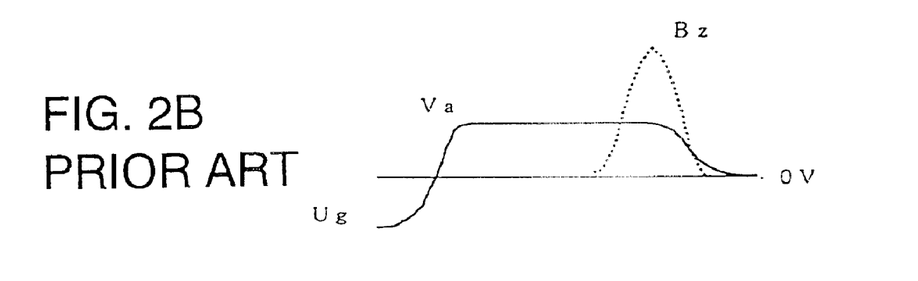
FIG. 2B is a graph showing potential distribution and magnetic field distribution for the electromagnetic field superimposed lens of the related art shown in FIG. 5.

For comparison, FIG. 2B schematically shows potential distribution and magnetic field distribution for the related art example shown in FIG. 5. An electron beam from the cathode (potential Ug, for example 1 kV) is accelerated between the cathode and the positively applied electron gun anode (potential: Va, for example +1 kV), and scanned inside the positive potential Va lens barrel at an energy Va−Ug (:2 kV). In the electromagnetic field superimposed lens, there is a magnetic field focusing action, as well as the action of a decelerating electrical field superimposed on the magnetic field, and the electron beam is irradiated on the ground potential sample (potential 0) at an energy of 0−Ug (: 1 kV). The aberration factor of the lens is reduced by the action of the magnetic field and the decelerating electrical field superimposed on the magnetic field. With the electromagnetic field superimposed lens 1 of the present invention, the lens barrel potential is ground potential except for at the electron gun section and electromagnetic field superimposed lens section, while with the related art example shown in FIG. 5 Va of a positive potential is applied.

Figure 3:
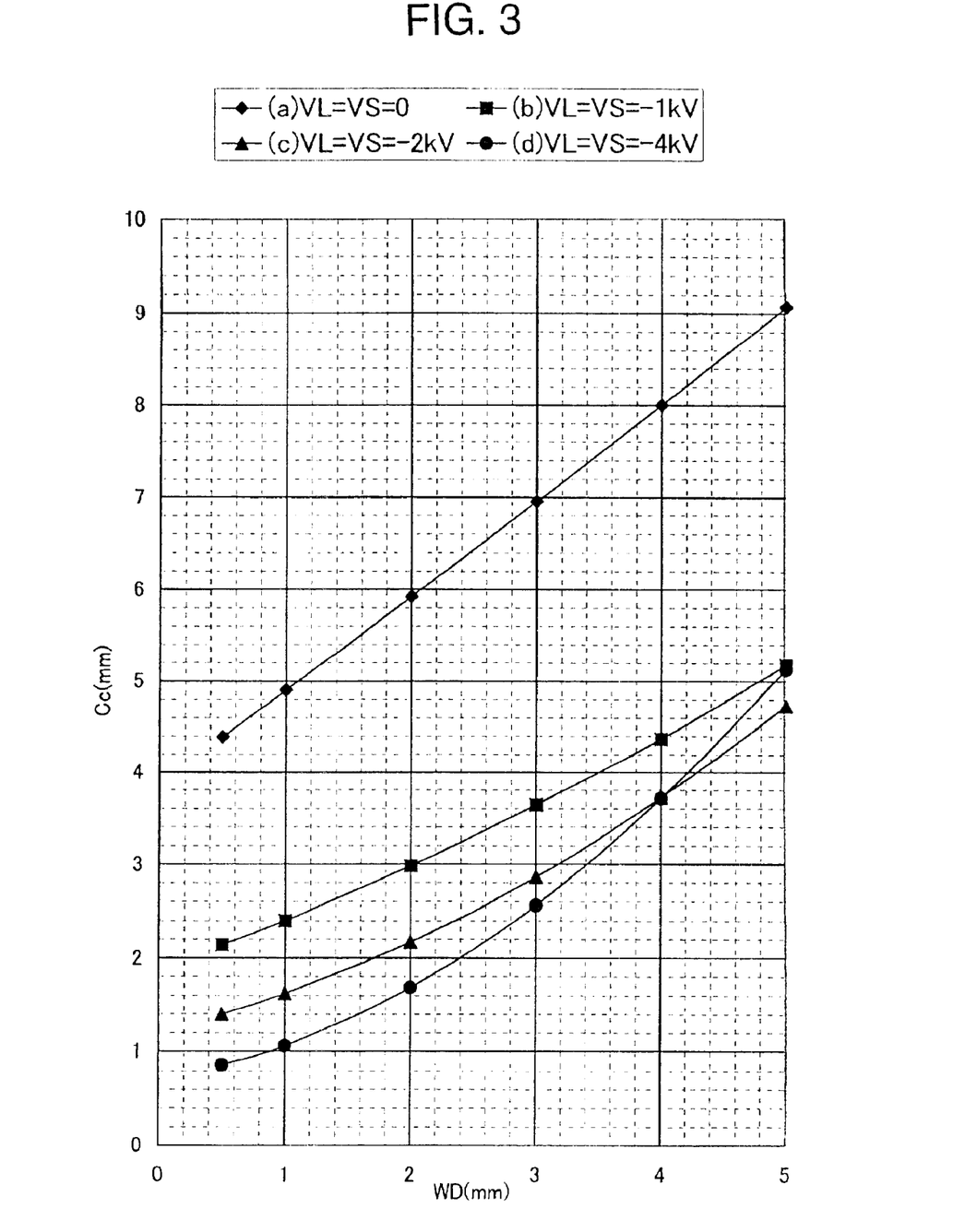
FIG. 3 is a graph showing calculation values for chromatic aberration factor characteristics in the electromagnetic field superimposed lens shown in FIG. 1.

FIG. 3 shows examples of calculated values for Wd (:distance from top face of second magnetic pole section 212 to sample 5) of chromatic aberration factor Cc that is predominant in image resolution for reduced acceleration voltage, in the electromagnetic field superimposed lens 1 shown in FIG. 1. Electron orbit is obtained for the place where the electrical field and magnetic field are superimposed, and the chromatic aberration factor Cc is calculated using a well known integration formula. The curved line (a) represents chromatic aberration factor Cc for the case when VL=VS=0, namely when potential is not applied to the second magnetic pole section 212 and the sample 5 (namely, for the lens used in the related art where the electrical field is not superimposed), the curved line (b) represents chromatic aberration factor for VL=VS=−1 kV, the curved line (c) represents chromatic aberration factor for VL=VS=−2 kV, and the curved line (d) represents chromatic aberration factor for VL=VS=−4 kV. In all cases, the energy of an electron beam irradiated on the sample is 1 kV. For example, in the case of VL=VS=−2 kV, the electron gun potential vg is set at −3 kv, and the electron beam is irradiated on the sample at an energy of VS−Ug. It will be understood that by superimposing the decelerating electrical field and the magnetic field the chromatic aberration factor is reduced, improving image resolution.

Even if the electrode 31 is eliminated and similarly the potential is applied to the second magnetic pole section 212 and the sample 5, the chromatic aberration factor Cc is reduced, but the reduction effect is slighter.

As will be understood from the above description, according to the electromagnetic field superimposed lens 1 it is possible to make chromatic aberration factor Cs, CC smaller, and as well as enabling high resolution observation, since it is possible to apply a negative high potential only to the second magnetic pole section 212 at the end of the lens barrel and to the sample 5 without forming a positive high potential section inside an electron beam passage of the lens barrel, it is possible to make it difficult for high voltage electric discharge to occur compared to the related art example where a positive high potential section extends over a comparatively wide range of the electron beam passage, which significantly improves maintainability and cost reduction compared to the structure of the related art shown in FIG. 5. The sample 5 is electrically insulated from the sample drive mechanism by an insulating member, which means that application of the negative high potential is easy.

As a result, as well as simplifying the structure of the electromagnetic field superimposed lens 1 and improving maintainability, in particular it is possible to realize an electromagnetic field superimposed lens and an electron beam device using this electromagnetic field superimposed lens that is stable and has high resolution with respect to a low acceleration sample irradiation voltage.

Figure 4:
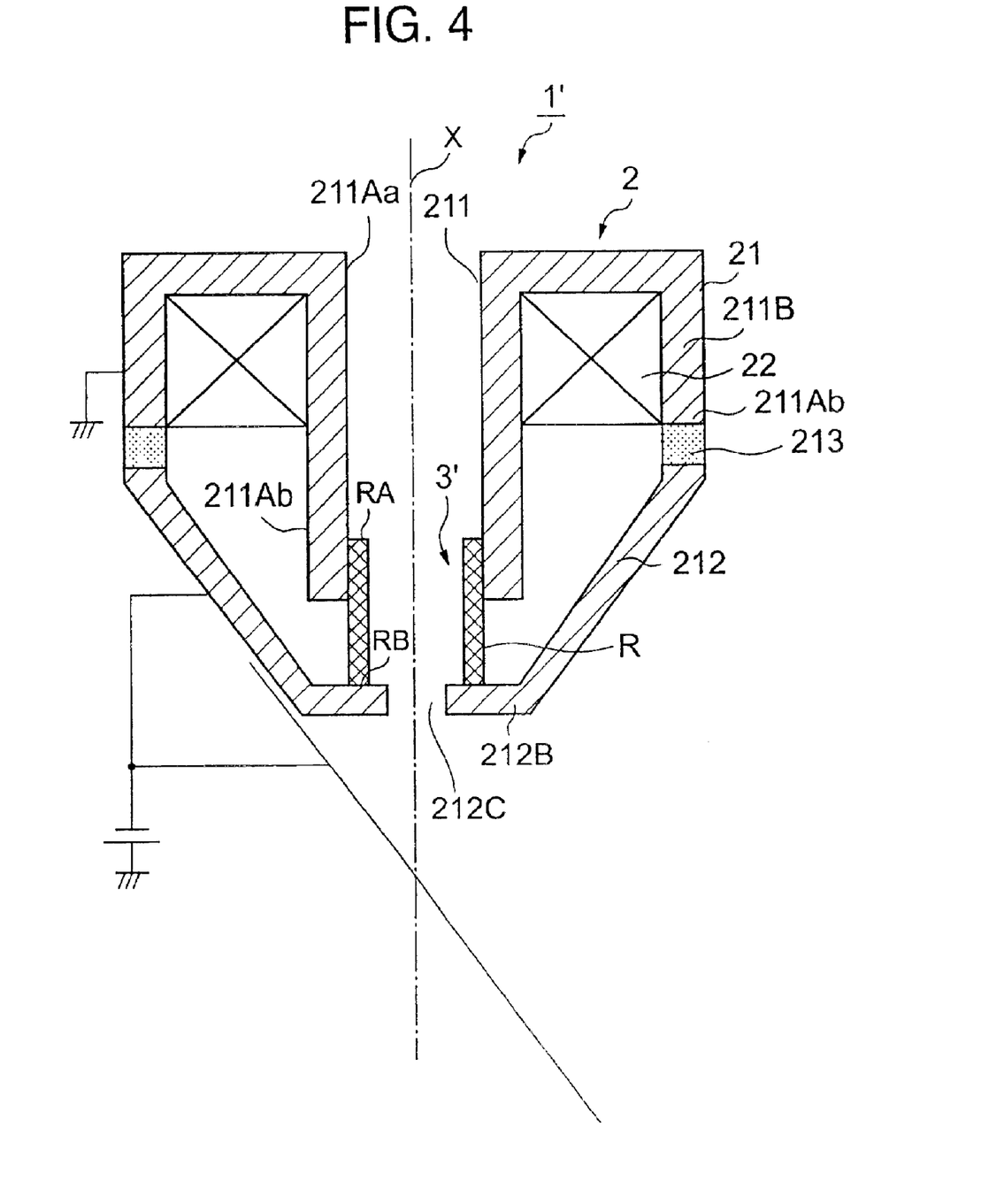
FIG. 4 is a cross sectional drawing showing another embodiment of an electromagnetic field superimposed lens of the present invention.

FIG. 4 shows another embodiment of the present invention. The electromagnetic field superimposed lens 1' shown in FIG. 4 is constructed with a high resistance body R built into the magnetic field type lens 2, and is only different from the electromagnetic field superimposed lens 1 shown in FIG. 1 in that the electrical field type bi-potential lens in FIG. 1 is replaced with the high resistance body R. Accordingly, the same numerals are used for the sections in FIG. 4, that correspond to those in FIG. 1, and the descriptions for those sections are omitted.

The high resistance body R is a cylindrical member similar to the electrode 31, and is constructed using a well known high resistance pipe or the like. One end RA of the high resistance body R is inserted into an inner side of the other end 211Ab and fixed so as to be coaxial with the optical axis X, and in this way, the end RA is electrically connected to the first magnetic pole section 211. On the other hand, the other end RB of the high resistance body R extends to the tip section 212B and is electrically connected to the second magnetic pole section 212.

In this way, the high resistance body R electrically connects between the first magnetic pole section 211 and the second magnetic pole section 212, which means that a potential gradient arises in the high resistance body R when a potential is applied across the first magnetic pole section 211 and the second magnetic pole section 212, and this makes it possible to form a decelerating electrical field for gradually switching over from the ground potential of the first magnetic pole section 211 to the negative high potential of the second magnetic pole section 212. With the electromagnetic field superimposed lens 1 shown in FIG. 1, if the gap between the electrode 31 and the second magnetic pole section 212 is made small for the purpose of reducing the chromatic aberration factor Cc there is a problem that it becomes easy for electrical discharge to occur, but with the structure of the electromagnetic field superimposed lens 11 shown in FIG. 4, this problem is solved.

With the embodiments described above, the electrode 31 or the electron beam side end surface of the high resistance body are at ground potential, but it is also possible to partially apply a positive potential having such a magnitude that its effect on the focusing of the electron beam can be ignored. For example, with the electromagnetic field superimposed lens 1 of FIG. 1, in the case where Ug=3 kV, it is possible to apply a potential of around 1 kV to the electrode 31 through the insulator. in this way it is possible to increase the deceleration effect with the negative high potential.

According to the present invention, in addition to the advantage that chromatic aberration factor Cs, Cc, being a characteristic of an electromagnetic field superimposed lens 1 is made small, and enabling high resolution observation, since there is a structure where a negative high potential is applied to the second magnetic pole section at the end of the lens barrel without forming a positive high potential section inside an electron beam passage of the lens barrel, it is possible to make it difficult for high voltage electric discharge to occur compared to the related art example where a positive high potential section extends over a comparatively wide range of the electron beam passage, making it possible to improve maintainability and reduce cost. As a result, stable high resolution observation is enabled with particularly low acceleration sample irradiation voltage.

Also, with the structure such that the high resistance body is electrically connected between the first magnetic pole section and the second magnetic pole section, causing a potential gradient to arise in the high resistance body when a potential is applied across the first magnetic pole section and the second magnetic pole section, making it possible to form a decelerating electrical field for gradually switching over from the ground potential of the first magnetic pole section to the negative high potential of the second magnetic pole section, the problem where it is easy for electrical discharge to occur when the gap between the electrode and the second magnetic pole section is reduced for the purpose of reducing chromatic aberration factor of the electromagnetic field superimposed lens with the example invention of FIG. 1 can be avoided, and exceptional effects of reducing the chromatic aberration factor can be expected.

What is claimed is:

1. An electromagnetic field superimposed lens having an electrical field bi-potential lens accommodated within a magnetic field lens, wherein:
    a magnetic pole of the magnetic field lens is divided into a first magnetic pole section to which an earth potential is applied during use, and a second magnetic pole section facing a sample, a negative potential being applied to the second magnetic pole and to the sample during use, and the first and second magnetic pole sections being electrically insulated from each other; and
    the electric field bi-potential lens comprises an electrode connected to the first magnetic pole section so as to surround an electron beam path of the superimposed lens, and the second magnetic pole section.

2. An electromagnetic field superimposed lens according to claim 1; further comprising an electrically insulating member disposed between confronting ends of the first and second electromagnetic pole sections such that the first and second electromagnetic pole sections and the electrically insulating member form an integral body.

3. An electromagnetic field superimposed lens according to claim 2; further comprising an excitation coil attached to an overhang portion of the first electromagnetic pole section extending radially from the electron beam path; wherein the second magnetic pole section extends from the electrically insulating member towards the sample and becomes narrower in cross-sectional diameter as it approaches the sample, and a magnetic gap is formed between ends of the first and second magnetic pole sections closest to the sample.

4. An electromagnetic field superimposed lens according to claim 3; wherein a magnetic pole of the superimposed lens is formed on a sample side of the second magnetic pole section.

5. An electron beam device having the electromagnetic field superimposed lens according to claim 1.

6. An electromagnetic field superimposed lens having an electrical field bi-potential lens accommodated within a magnetic field lens: wherein
    a magnetic pole of the magnetic field lens is divided into a first magnetic pole section to which an earth potential is applied during use, and a second magnetic pole section facing a sample, a negative potential being applied to the second magnetic pole section and to the sample during use, and the first and second magnetic pole sections being electrically insulated from each other; and
    the electrical field bi-potential lens comprises a high resistance body provided between the first magnetic pole section and the second magnetic pole section so as to surround an electron beam path of the superimposed lens, such that a potential difference exists between the first magnetic pole section and the second magnetic pole section.

7. An electromagnetic field superimposed lens according to claim 6; further comprising an electrically insulating member disposed between confronting ends of the first and second electromagnetic pole sections such that the first and second electromagnetic pole sections and the electrically insulating member form an integral body.

8. An electromagnetic field superimposed lens according to claim 7; further comprising an excitation coil attached to an overhang portion of the first electromagnetic pole section extending radially from the electron beam path; wherein the second magnetic pole section extends from the electrically insulating member towards the sample and becomes narrower in cross-sectional diameter as it approaches the sample, and a magnetic gap is formed between ends of the first and second magnetic pole sections closest to the sample.

9. An electron beam device having the electromagnetic field superimposed lens according to claim 6.

10. A composite electromagnetic field lens, comprising: a magnetic field lens for producing a magnetic focusing field for focusing an electron beam along an optical axis, the magnetic field lens comprising a first magnetic pole section surrounding the optical axis and having an overhang portion extending radially outward from the optical axis, an excitation coil disposed in the overhang portion, and a second magnetic pole section extending from a location near the overhang portion toward a sample to be irradiated with the focused electron beam; and an electric field lens accommodated within the magnetic field lens for superimposing a decelerating electric field onto the magnetic focusing field to reduce an aberration factor of the lens, the electric field lens comprising a high resistance body surrounding the optical axis arid electrically connecting the first and second magnetic pole sections.

11. A composite lens according to claim 10; further comprising a voltage source for applying a negative potential to the second magnetic pole section and the sample and applying a ground potential to the first magnetic pole section.

12. A composite lens according to claim 10; wherein a magnetic gap is formed between the tip of the second pole section and an end of the first pole section opposite the overhang section so that the focusing magnetic field is generated in the magnetic gap upon application of an electric current to the excitation coil.

13. A composite lens according to claim 10; wherein the second pole section has a conical shape with a tip facing the sample.

14. A composite electromagnetic field lens, comprising: a magnetic field lens for producing a magnetic focusing field for focusing an electron beam along an optical axis, the magnetic field lens comprising a first magnetic pole section surrounding the optical axis and having an overhang portion extending radially outward from the optical axis, an excitation coil disposed in the overhang portion, and a second magnetic pole section extending from a location near the overhang portion toward a sample to be irradiated with the focused electron beam; and an electric field lens accommodated within the magnetic field lens for superimposing a decelerating electric field onto the magnetic focusing field to reduce an aberration factor of the lens, the electric field lens having an electrode formed of a non-magnetic conductive material, the electrode having an outer diameter corresponding to an inner diameter of the first pole section so that a first end of the electrode is received in the first pole section and is electrically connected thereto.

15. A composite lens according to claim 14; wherein a second end of the electrode faces the tip of the second magnetic pole section with a predetermined distance therebetween.

16. A composite electromagnetic field lens, comprising: a magnetic field lens for producing a magnetic focusing field for focusing an electron beam along an optical axis, the magnetic field lens comprising a first magnetic pole section surrounding the optical axis and having an overhang portion extending radially outward from the optical axis, an excitation coil disposed in the overhang portion, a second magnetic pole section extending from the overhang portion toward a sample to be irradiated with the focused electron beam, and a voltage source for applying a negative potential to the second magnetic pole section and the sample and applying a ground potential to the first magnetic pole section during use of the magnetic field lens; and an electric field lens accommodated within the magnetic field lens for superimposing a decelerating electric field onto the magnetic focusing field to reduce an aberration factor of the lens, the electric field lens comprising a high resistance body surrounding the optical axis and electrically connecting the first and second magnetic pole sections.

17. A composite electromagnetic field lens according to claim 16; further comprising an electrically insulating member disposed between the overhang section and the second magnetic pole section.

18. A composite electromagnetic field lens according to claim 16; wherein a magnetic gap is formed between the tip of the second pole section and an end of the first pole section opposite the overhang section so that the focusing magnetic field is generated in the magnetic gap upon application of an electric current to the excitation coil.

19. A composite electromagnetic field lens according to claim 16; wherein the second pole section has a conical shape with a tip facing the sample.

* * * * *